(12) United States Patent
Chen et al.

(10) Patent No.: US 8,390,089 B2
(45) Date of Patent: Mar. 5, 2013

(54) IMAGE SENSOR WITH DEEP TRENCH ISOLATION STRUCTURE

(75) Inventors: Szu-Ying Chen, Taichung (TW); Chun-Chieh Chuang, Tainan (TW); Jen-Cheng Liu, Hsin-Chu (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 308 days.

(21) Appl. No.: 12/844,642

(22) Filed: Jul. 27, 2010

(65) Prior Publication Data
US 2012/0025199 A1     Feb. 2, 2012

(51) Int. Cl.
    *H01L 21/00* (2006.01)
(52) U.S. Cl. .............. 257/447; 257/460; 257/E31.052; 257/E31.127; 438/48; 438/64
(58) Field of Classification Search ................. 257/447, 257/460, E31.052, E31.127; 438/46, 64, 438/48
See application file for complete search history.

(56) References Cited

U.S. PATENT DOCUMENTS

| | | | |
|---|---|---|---|
| 5,043,785 A * | 8/1991 | Mizutani et al. | 257/443 |
| 2007/0252731 A1* | 11/2007 | Chung | 341/50 |
| 2009/0020845 A1* | 1/2009 | Shin et al. | 257/506 |
| 2009/0140365 A1* | 6/2009 | Lee et al. | 257/460 |
| 2010/0148189 A1* | 6/2010 | Fang et al. | 257/79 |

* cited by examiner

*Primary Examiner* — Long Tran
(74) *Attorney, Agent, or Firm* — Haynes and Boone, LLP

(57) ABSTRACT

Provided is a back side illuminated image sensor device. The image sensor device includes a substrate having a front side and a back side opposite the front side. The image sensor also includes a radiation-detection device that is formed in the substrate. The radiation-detection device is operable to detect a radiation wave that enters the substrate through the back side. The image sensor further includes a deep trench isolation feature that is disposed adjacent to the radiation-detection device. The image sensor device further includes a doped layer that at least partially surrounds the deep trench isolation feature in a conformal manner.

20 Claims, 12 Drawing Sheets

IMAGE SENSOR WITH DEEP TRENCH ISOLATION STRUCTURE

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

A back side illuminated (BSI) image sensor device is one type of image sensor device. As transistor device size shrinks with each technology generation, existing BSI image sensor devices may begin to suffer from issues related to cross-talk and blooming. These issues may be caused by insufficient isolation between neighboring pixels of the BSI image sensor.

Therefore, while existing methods of fabricating BSI image sensor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
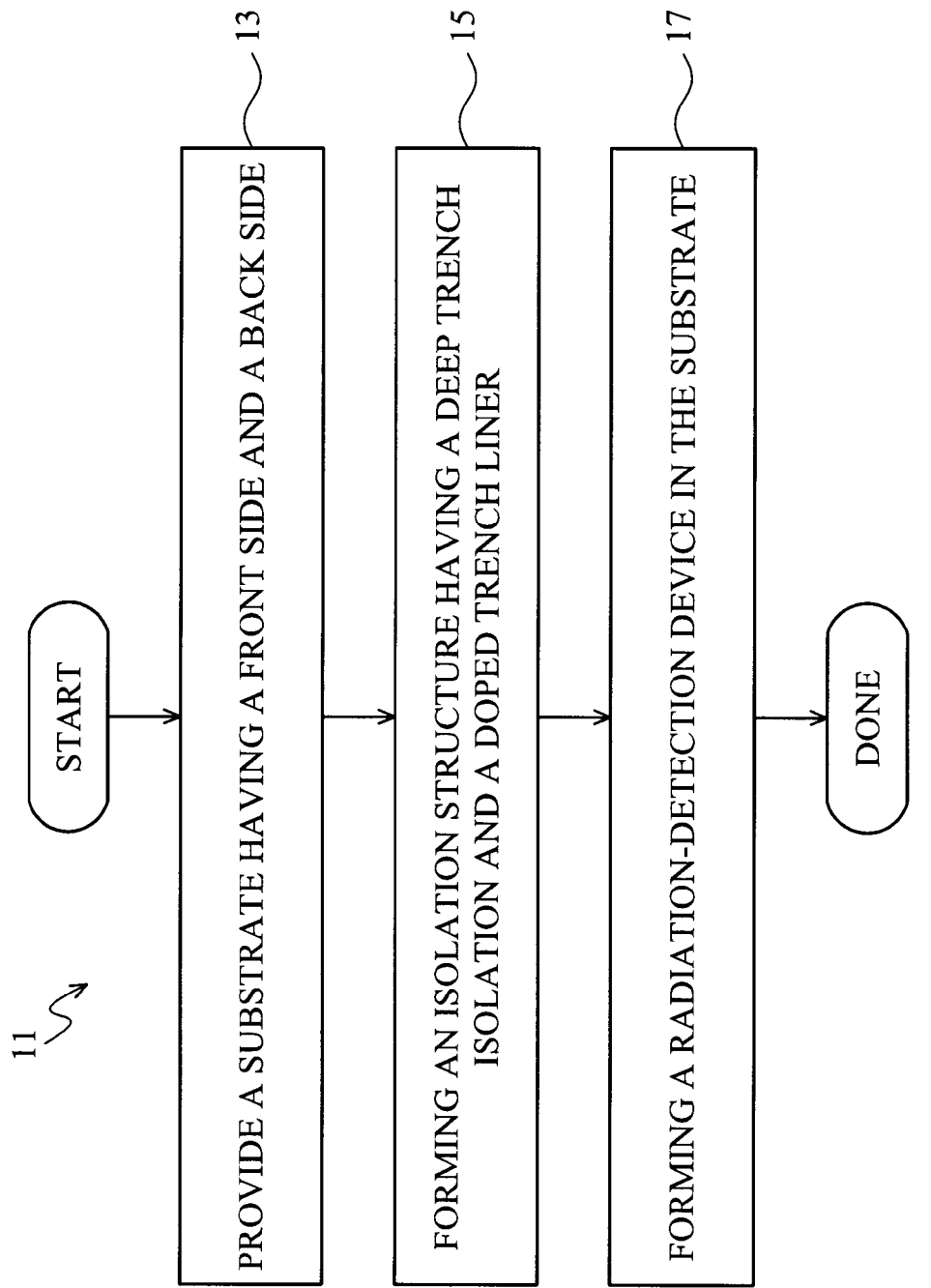
FIG. 1 is a flowchart illustrating a method for fabricating an image sensor device according to various aspects of the present disclosure.

Illustrated in FIG. 1 is a flowchart of a method 11 for fabricating a back-side illuminated (BSI) image sensor device according to various aspects of the present disclosure. Referring to FIG. 1, the method 11 begins with block 13 in which a substrate having a front side and a back side is provided. The method 11 continues with block 15 in which an isolation structure is formed in the substrate. The substrate includes a deep trench isolation device and a doped trench liner that at least partially surrounds the deep trench isolation device. The method 11 continues with block 17 in which a radiation-detection device is formed in the substrate. The radiation-detection device is operable to sense radiation projected toward the radiation-detection device from the back side. It is understood that additional processes may be performed before the block 13 or after block 17, or in between the blocks 13, 15, and 17 to complete the fabrication of the image sensor device.

FIGS. 2 to 7 are diagrammatic fragmentary cross-sectional side views of a portion of a BSI image sensor device 30A at various fabrication stages according to an embodiment of the method 11 of FIG. 1. It is understood that FIGS. 2 to 7 have been simplified for a better understanding of the inventive concepts of the present disclosure.

Figure 2:
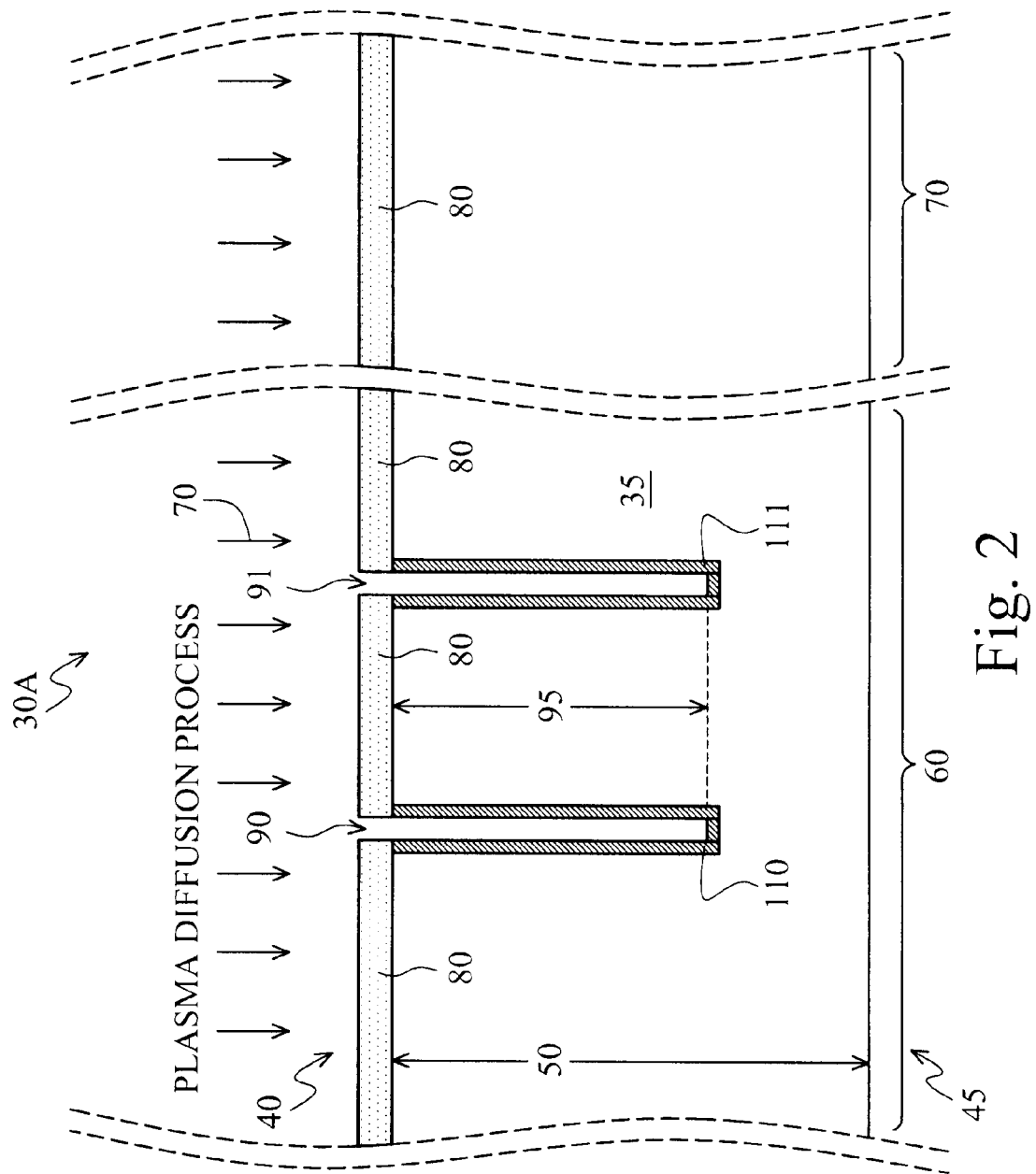
FIGS. 2-7 are diagrammatic fragmentary cross-sectional side views of an image sensor device at various stages of fabrication in accordance with an embodiment of the method illustrated in FIG. 1.

Referring to FIG. 2, the image sensor device 30A includes a substrate 35, also referred to as a device substrate. The substrate 35 is a silicon substrate doped with a P-type dopant such as boron, in which case the substrate 35 is a P-type substrate. Alternatively, the substrate 35 could be another suitable semiconductor material. For example, the substrate 35 may be a silicon substrate that is doped with an N-type dopant such as phosphorous or arsenic, in which case the substrate 35 is an N-type substrate. The substrate 35 may include other elementary semiconductors such as germanium and diamond. The substrate 35 may optionally include a compound semiconductor and/or an alloy semiconductor. Further, the substrate 35 may include an epitaxial layer (epi layer), may be strained for performance enhancement, and may include a silicon-on-insulator (SOI) structure.

The substrate 35 has a front side 40 and a back side 45. The front side 40 may also be referred to as a front surface, and the back side 45 may also be referred to as a back surface. The substrate 35 has an initial thickness 50 that is in a range from approximately 100 microns (um) to approximately 3000 um. In an embodiment, the initial thickness 50 is approximately 700 um.

The substrate 35 includes various regions, which may include a pixel-array region, a periphery region, a bonding pad region, and a scribe line region. For the sake of simplicity, only a portion of the pixel-array region 60 (also referred to as the pixel region) and the periphery region 70 are shown in FIG. 2. The pixel-array region 60 is where arrays of radiation-sensing pixels are to be formed. The periphery region 70 is where non-radiation-sensing devices are formed, such as digital devices or control devices. The devices formed in the pixel-array region 60 and the periphery region 70 will be discussed in more detail later.

A patterned hard mask layer 80 is then formed over the front side 40 of the substrate 35. The patterned hard mask layer 80 may be formed by first forming a hard mask material over the front side 40 using a deposition process known in the art, such as a chemical vapor deposition (CVD) process, a physical vapor deposition (PVD) process, or an atomic layer deposition (ALD) process. The hard mask material is then patterned in a photolithography process that may involve a photoresist material (not illustrated) and various exposure, developing, baking, stripping, and etching processes. As a result, the patterned hard mask layer 80 is formed.

The patterned hard mask layer 80 has openings 90 and 91 therein. These openings 90 and 91 are etched further into the pixel-array region 60 of the substrate 35 to form deep trenches 90 and 91, for example by using a dry etching process known in the art. The patterned hard mask layer 80 serves as a protective mask during the etching process. The deep trenches 90-91 have a depth 95 that is in a range from approximately 1 micron (um) to approximately 3 um. The deep trenches 90-91 may have approximately rectangular shapes, trapezoidal shapes, elongated elliptical shapes, or other suitable shapes.

A plasma diffusion process 100 is then performed on the deep trenches 90 and 91 while using the patterned hard mask layer 80 as a protective mask. The plasma diffusion process 100 may involve a plasma-immersion ion implantation, and may achieve a dopant depth in a range from about 500 angstroms to about 2500 angstroms, and a dosage range in a range from about 1E10 ions/$cm^2$ to about 1E14 ions/$cm^2$. As a result of the plasma diffusion process 100, doped trench liners 110 and 111 are respectively formed around the deep trenches 90 and 91. The doped trench liners 110 and 111 are essentially formed by doping portions of the substrate 35 surrounding the deep trenches 90 and 91 with the dopant used in the plasma diffusion process.

The doped trench liners 110-111 formed as a result of the plasma diffusion process 100 each have a substantially uniform doping profile. The uniform doping profile means that the doping concentration levels at various regions within the doped trench liners 110-111 do not vary substantially from one another. For example, a doping concentration level measured at a portion of the doped trench liner 110 near the front side 40 is about the same as a doping concentration level measured at a portion of the doped trench liner 110 near the back side 45. This characteristic is partially a result of the fact that the plasma diffusion causes the dopant to diffuse uniformly in all directions. Thus, such uniform doping profile cannot typically be achieved by conventional implantation processes, which would tend to result in a much heavier dopant concentration near the bottom of the deep trenches 110-111 (closer to the back side 45) than near the side walls of the deep trenches. Further, the doped trench liners 110-111 are each formed around the deep trenches 90-91 in a conformal manner, so that the doped trench liners 110-111 at least partially surround the deep trenches 90-91, respectively.

Processes (such as etching processes) used to form the deep trenches 90-91 may result in defects (such as dangling bonds) on the surfaces of the deep trenches. These defects may be physical defects or electrical defects and could trap carriers such as electrons. The trapped carriers may produce leakage current. Leakage current is problematic for image sensors such as the image sensor device 30. For example, with a sufficient amount of leakage current, radiation-detection devices (not formed yet at this stage of fabrication) may falsely detect "light", even when the image sensor device 30A is placed in an optically dark environment. Alternatively stated, the image sensor device 30A may end up "sensing" light when it shouldn't have (since there is actually no light). In this situation, the leakage current may be referred to as a "dark current", and the pixel containing the radiation-detection device may become what is referred to as a "white pixel". Dark currents and white pixels are forms of electrical cross-talk and degrade the performance of the image sensor device 30A and are therefore undesirable.

Here, the doped trench liners 110-111 substantially seal off these defects on the surfaces of the deep trenches 90-91. The sealed-off defects are not able to move around freely, and thus will be much less likely to cause leakage current. As such, the doped trench liners 110-111 help eliminate the dark current or white pixel defects and therefore reduce electrical cross-talk.

Figure 3:
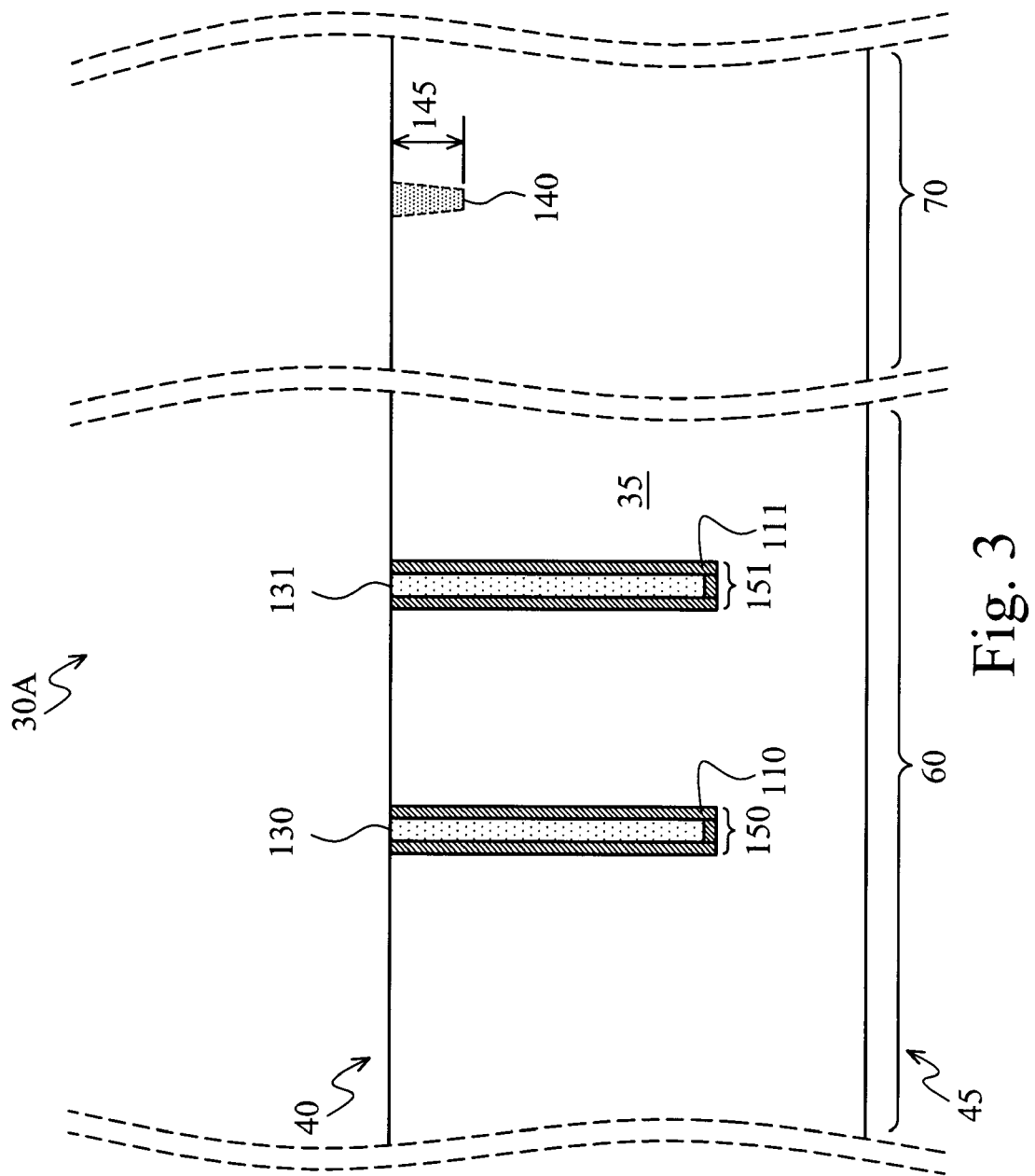

Referring now to FIG. 3, the patterned hard mask layer 80 (shown in FIG. 2) is removed, and the deep trenches 90-91 (shown in FIG. 2) are filled with a dielectric material to form deep trench isolation (DTI) features 130-131 (also referred to as DTI devices), respectively. The DTI features may be formed by depositing a dielectric material (such as an oxide material or a nitride material) from the front side 40 into the deep trenches 90-91, and thereafter removing the portions of the dielectric material outside the deep trenches with a chemical-mechanical polishing (CMP) process. The doped trench liner 110 and the DTI feature 130 may be collectively referred to as an isolation structure 150. Similarly, the doped trench liner 111 and the DTI feature 131 may be collectively referred to as another isolation structure 151.

A shallow trench isolation (STI) feature 140 may also be formed in the periphery region 70 of the substrate 35. The STI feature 140 may be formed by etching a shallow opening into the substrate 35 from the front side 40 and filling the opening with an oxide material or a nitride material. The STI feature 140 has a depth 145 that is less than 1 um, and may be formed before or after the formation of the DTI features 130-131. Also, it is understood that a plurality of other DTI features and STI features may be formed in the pixel-array region 60 and the periphery region 70. Only the DTI features 110-111 and the STI feature 140 are illustrated herein for the sake of providing an example and for facilitating ensuing discussions.

Figure 4:
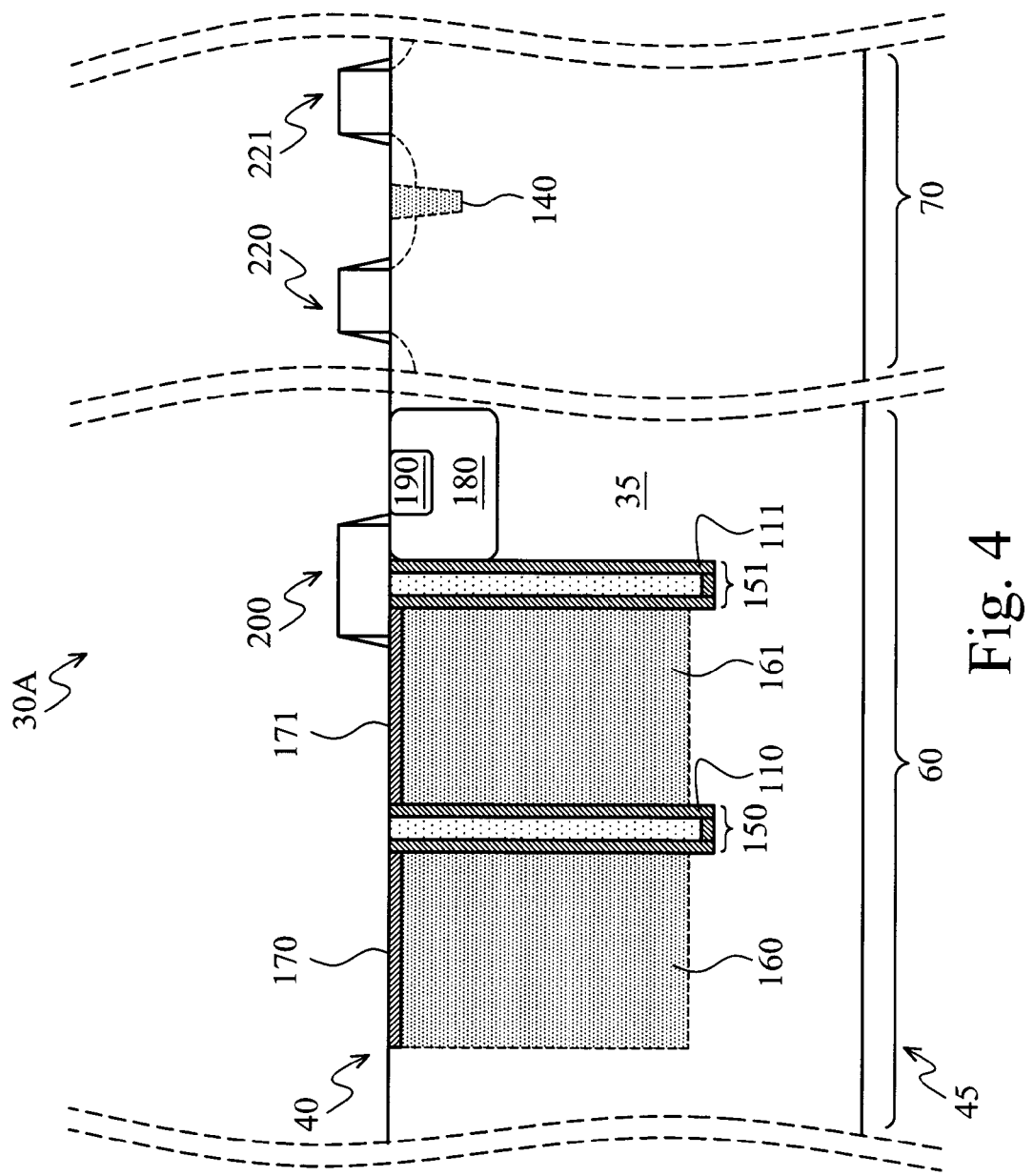

Referring now to FIG. 4, radiation-detection devices 160 and 161 (also referred to as radiation-sensing regions) are formed in the pixel-array region 60 of the substrate 35. The radiation-detection device 161 is formed between the isolation structures 150 and 151. The radiation-detection device 160 is formed between the isolation structure 150 and another isolation structure (not illustrated) on the opposite side of the radiation-detection device.

The radiation-detection devices 160-161 are formed by performing an ion implantation process on the substrate 35 from the front side 40. The ion implantation process implants the substrate 35 with a dopant having an opposite doping polarity as the substrate 35. For example, in an embodiment where the substrate 35 is a P-type substrate, the radiation-detection devices 160-161 are doped with an N-type dopant. In another embodiment where the substrate 35 is an N-type substrate, the radiation-detection devices 160-161 are doped with a P-type dopant. Thus, the doping polarity of the radiation-detection devices 160-161 are opposite from the doping polarity of the doped trench liners 110-111.

In the embodiment shown in FIG. 4, the radiation-detection devices 160-161 are formed adjacent to or near the front side 40 of the substrate 35. In alternative embodiments, depending on the design needs and manufacturing requirements, the radiation-detection devices 160-161 may be formed further away from the front side 40. The position or location of the radiation-detection devices 160-161 may be adjusted by tuning an implantation energy level of the implantation process used to form these radiation-detection devices. For example, a higher implantation energy level results in a deeper implant, which means the radiation-detection devices 160-161 are formed further away from the front side 40. Similarly, a smaller implantation energy level causes the radiation-detection devices 160-161 to be formed closer to the front side 40.

The radiation-detection devices 160-161 are operable to sense or detect radiation waves projected toward the radiation-detection devices 160-161 through the back side 45 of the substrate 35. The radiation-detection devices 160-161 may be able to sense or detect radiation having specific wavelengths, which may correspond to lights of different colors. In an embodiment, the radiation-detection devices 160-161 include a photodiode. In other embodiments, the radiation-detection devices 160-161 may include other types of photodiodes, photogates, reset transistors, source follower transistors, or transfer transistors. For the sake of simplicity, the structural details of the radiation-detection devices 160-161 are not illustrated.

In addition, pinned implant layers 170 and 171 may be formed over the radiation-detection devices 160 and 161 on the front side 40, respectively. The pinned implant layers 170-171 are each doped with a dopant that is of the same doping polarity as the doped trench liners 110-111 (and thus the opposite doping polarity as the radiation-detection devices 160-161).

As discussed above, electrical cross-talk in the forms of dark currents and white pixels may be caused by defects along the surfaces of the deep trenches 90-91. These defects are cured by the doped trench liners 110-111 in the present embodiment. During the operation of the image sensor device 30A, optical cross-talk may also occur when photons from the radiation waves that are intended to be received by one radiation-detection device (such as the device 160) end up being received by an unintended neighboring radiation-detection device (such as the device 161). Here, the isolation structures 150 and 151 in conjunction with the pinned implant layers 170-171 provide sufficient isolation between the neighboring radiation-detection devices, thus substantially reducing optical cross-talk in addition to reducing electrical cross-talk.

Still referring to FIG. 4, a doped well 180 may be formed adjacent to the isolation structure 151. A floating diffusion (FD) node 190 may be formed in the well. A gate 200 may be formed over the front side 40 of the substrate 35. The gate 200 may include a gate dielectric layer, a gate electrode layer, and gate spacers formed on the sidewalls of the gate. Meanwhile, transistor devices 220 and 221 may be formed on either side of the STI 140 in the periphery region 70. The transistor devices 220-221 may each include a gate, a source, and a drain, and may be formed in a doped well. The transistor devices 220-221 may include devices that need to be kept optically dark. These devices may be digital devices, such as application-specific integrated circuit (ASIC) devices or system-on-chip (SOC) devices. In addition to the transistor devices 220-221, the periphery region 70 may further include reference pixels (not illustrated) that are used to establish a baseline of an intensity of light for the image sensor device 30.

Figure 5:
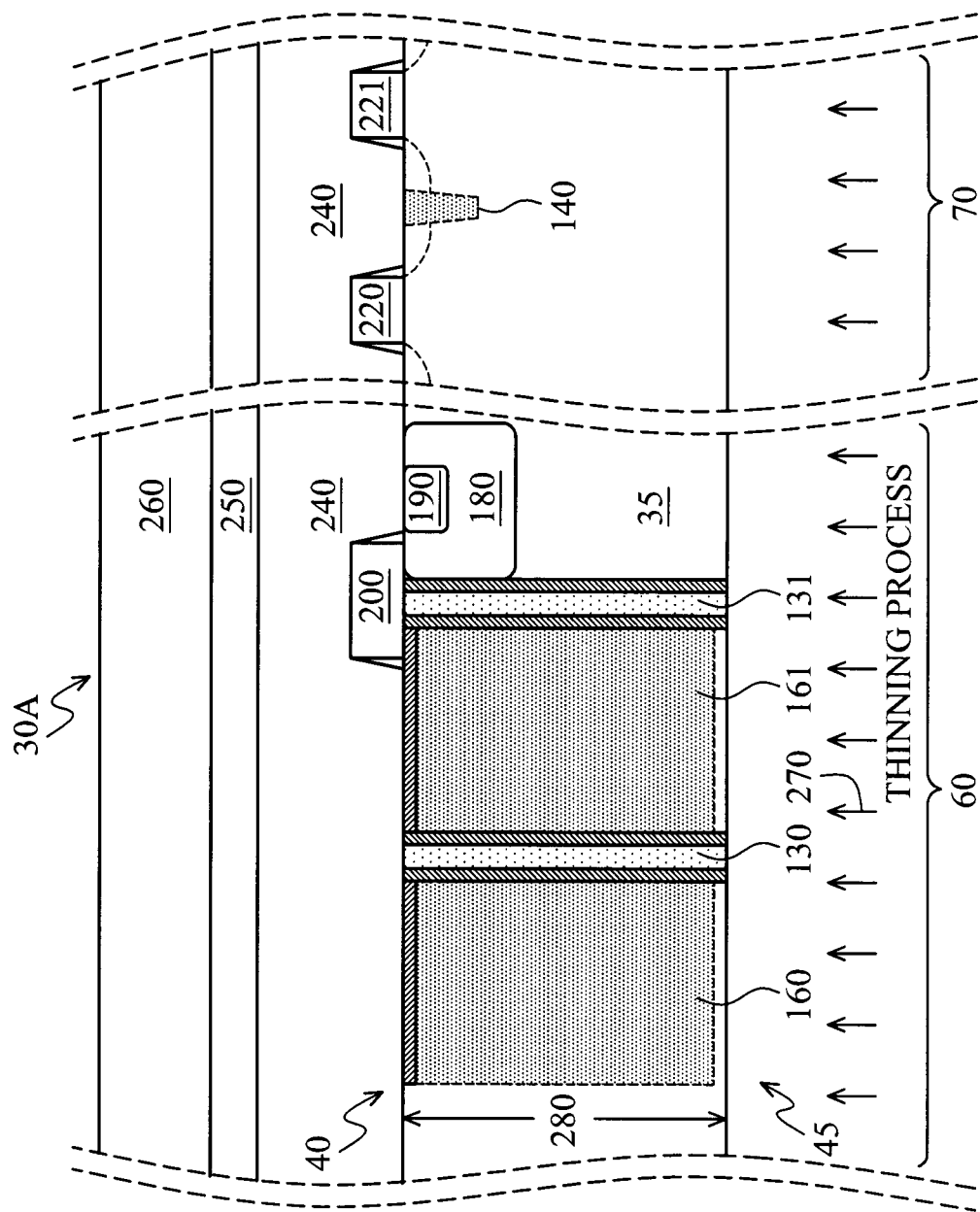

Referring now to FIG. 5, an interconnect structure 240 is formed over the front side 40 of the substrate 35. The interconnect structure 240 includes a plurality of patterned dielectric layers and conductive layers that provide interconnections (e.g., wiring) between the various doped features, circuitry, and input/output of the image sensor device 30. The interconnect structure 240 includes an interlayer dielectric (ILD) and a multilayer interconnect (MLI) structure formed in a configuration such that the ILD separates and isolates each MLI structure from other MLI structures. The MLI structure includes contacts/vias and metal lines formed on the substrate 35. For the sake of simplicity, these contacts/vias and metal lines are not illustrated in detail in FIG. 5.

In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including PVD, CVD, or combinations thereof. Other manufacturing techniques to form the aluminum interconnect may include photolithography processing and etching to pattern the conductive materials for vertical connection (contacts/vias) and horizontal connection (conductive lines). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

A buffer layer 250 is formed on the interconnect structure 240. In an embodiment, the buffer layer 250 includes a dielectric material such as silicon oxide. Alternatively, the buffer layer 250 may optionally include silicon nitride. The buffer layer 250 is formed by CVD, PVD, or other suitable techniques. The buffer layer 250 is planarized to form a smooth surface by a chemical-mechanical-polishing (CMP) process.

A carrier substrate 260 is then bonded with the buffer layer 250 so that processing of the back side 45 of the substrate 35 can be performed. The carrier substrate 260 is bonded to the buffer layer 250 by molecular forces. The carrier substrate 260 may be similar to the substrate 35 and includes a silicon material. Alternatively, the carrier substrate 260 may optionally include a glass substrate. The carrier substrate 260 provides protection for the various features formed on the front side 40 of the substrate 35. The carrier substrate 260 also provides mechanical strength and support for processing the back side 45 of the substrate 35, which will be discussed below. An annealing process may optionally be performed to enhance bonding strength. The buffer layer 250 provides electrical isolation between the substrate 35 and the carrier substrate 260.

Thereafter, a thinning process 270 (also referred to as a thin down process) is performed to thin the substrate 35 from the back side 45. In an embodiment, the thinning process 270 includes a CMP process. The thinning process 270 may also include a diamond scrubbing process, a grinding process, or other suitable techniques. A substantial amount of material may be removed from the substrate 35 by the process 270. In an embodiment, the thinning process 270 does not end until the back portions of the DTI features 130-131 have been reached, so that the radiation-detection devices 160-161 can be completely isolated from each other by the DTI features 130-131. After the thinning process 270 is performed, the substrate 35 has a thickness 280, which is in a range from approximately 1 μm to approximately 3 μm.

Figure 6:
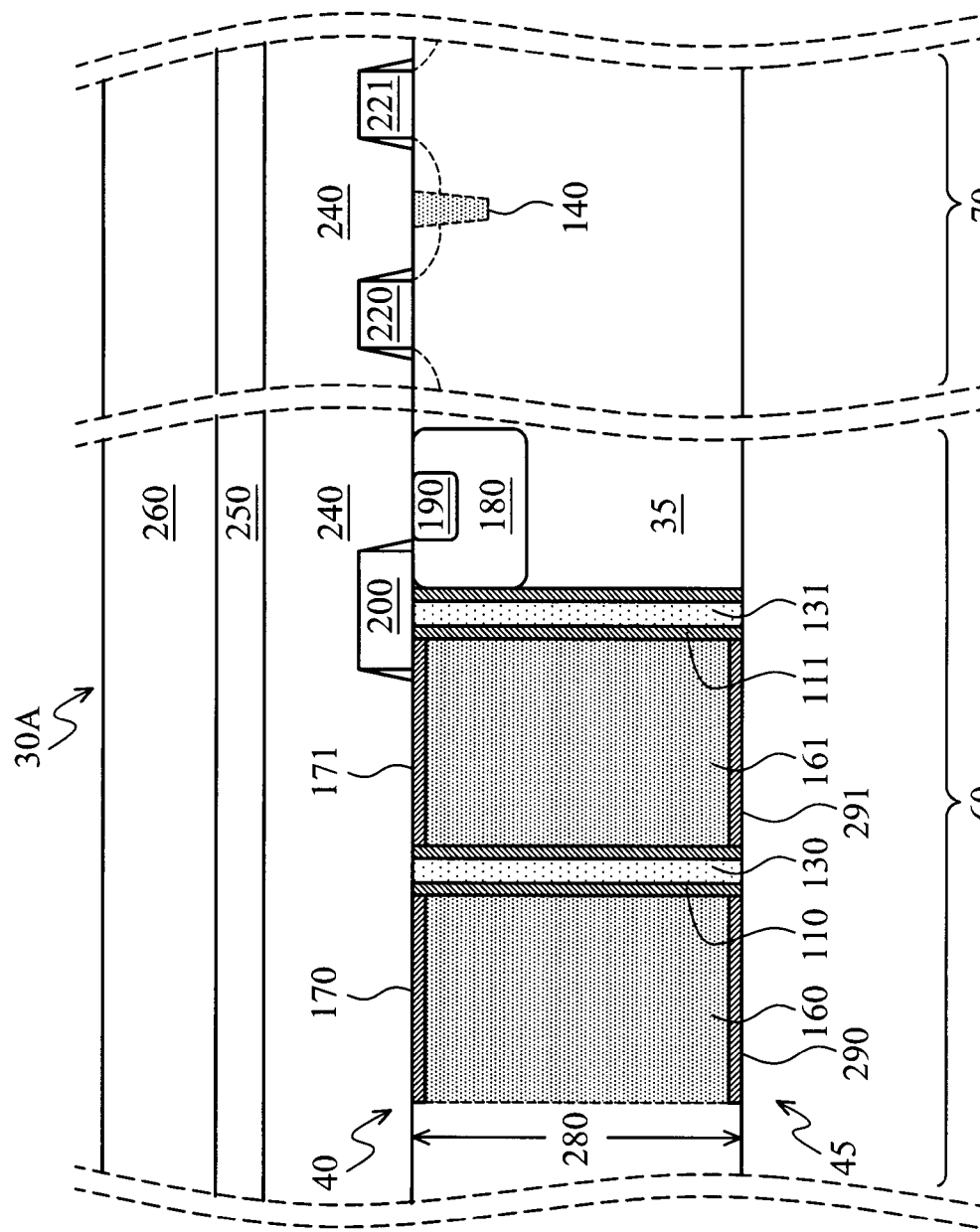

Referring now to FIG. 6, pinned implant layers 290 and 291 may be formed over the radiation-detection devices 160 and 161 on the back side 45, respectively. The pinned implant layers 290-291 are each doped with a dopant that is of the same doping polarity as the doped trench liners 110-111 (and thus the opposite doping polarity as the radiation-detection devices 160-161).

At this point of the fabrication, the radiation-detection devices 160 and 161 are completely isolated from each other. The radiation-detection device 160 is surrounded by the pinned implant layers 170 and 290 as well as a portion of the doped trench liner 110 (on the left side of the DTI feature 130). It is understood that an additional un-illustrated trench liner may be formed to surround the radiation-detection device 160 on its left side. The radiation-detection device 161 is surrounded by the pinned implant layers 171 and 291 as well as portions of the doped trench liners 110-111. These doped layers surrounding the radiation-detection devices 160-161 may also be referred to as isolation wells.

As discussed above, the complete isolation between the radiation-detection devices 160 and 161 help reduce electrical and optical cross-talk. However, the isolation well surrounding the radiation-detection device 160 is now also electrically isolated from the isolation well surrounding the radiation-detection device 161. In other words, these isolation wells are now "floating", or not necessarily having the same electrical potential (voltage). Proper operation of the image sensor device 30A may need these isolation wells to be biased to the same voltage, for example electrically grounded. The present disclosure offers several different embodiments to properly set the potential to the isolation wells.

Figure 7:
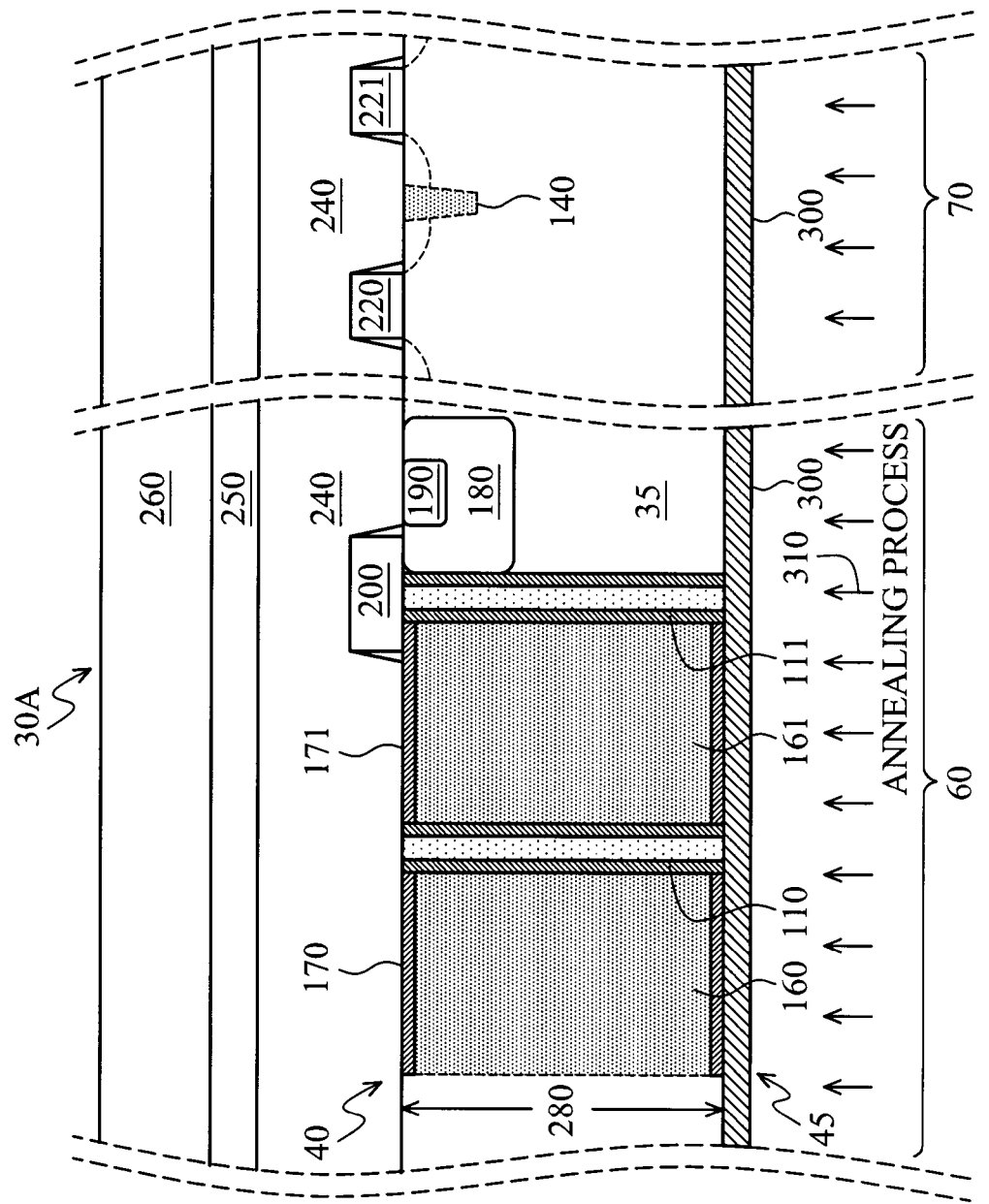

Referring now to FIG. 7, an amorphous silicon layer 300 is formed over the back side 45 of the substrate 35, and over both the pixel-array region 60 and the periphery region 70. The amorphous silicon layer 300 may be formed by a suitable process known in the art, such as CVD, PVD or ALD processes. A thickness of the amorphous silicon layer 300 may be in a range from about 500 angstroms to about 1500 angstroms.

Thereafter, an annealing process 310 may be performed to the amorphous silicon layer 300. In an embodiment, the annealing process 310 includes a laser annealing process and can reach an annealing temperature that is sufficiently high to melt the amorphous silicon layer 300 so that the amorphous silicon layer can be re-crystallized. The laser power and annealing duration are adjusted to achieve a silicon melting temperature of greater than about 1400 degrees Celsius. Thus, after the annealing process 310 is performed, the amorphous silicon layer 300 may also be referred to as a re-crystallized silicon layer 300. It is understood that the temperature of the annealing process 310 is controlled so as to not exceed an allocated thermal budget for the image sensor device 30A.

The re-crystallized silicon layer 300 (the amorphous silicon layer 300 that has been recrystallized) has substantially lower resistivity (in the form of a sheet resistance) compared to un-melted silicon, such as the substrate 35. The resistivity of the recrystallized silicon layer 300 may be low enough that it is practically conductive. In this manner, the isolation wells surrounding the radiation-detection devices 160 and 161 are both electrically coupled to the re-crystallized silicon layer 300. Thus, these isolation wells can be biased to the same potential by biasing the re-crystallized silicon layer 300. For example, when the re-crystallized silicon layer 300 is grounded, the isolation wells are grounded as well. Hence, the isolation wells would no longer be floating. It is also understood that the re-crystallized silicon layer 300 is substantially transparent, and as such will not interfere with the sensing of radiation waves projected toward the image sensor device 30A from the back side 45.

FIGS. 8-12 are diagrammatic fragmentary cross-sectional side views of a portion of a respective BSI image sensor device at a fabrication stage according to various alternative embodiments of the method 11 of FIG. 1. These alternative embodiments are similar to the embodiment described above in association with FIGS. 2-7. Thus, for purposes of consistency and clarity, similar features are labeled the same in all embodiments.

Figure 8:
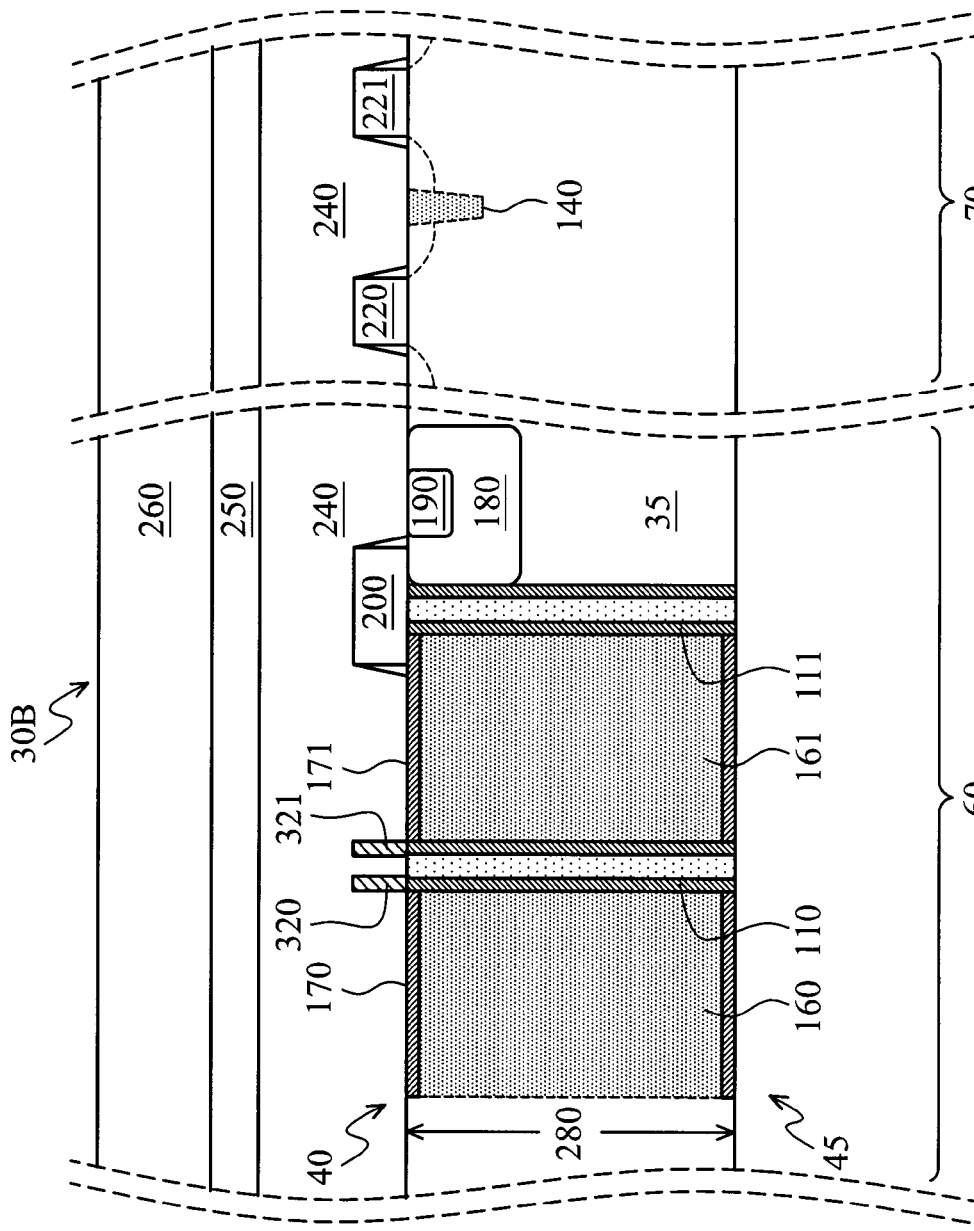
FIGS. 8-12 are diagrammatic fragmentary cross-sectional side views of respective image sensor devices at a stage of fabrication in accordance with various alternative embodiments of the method illustrated in FIG. 1.

Referring to FIG. 8, an image sensor device 30B is illustrated. One difference between the image sensor device 30B and the image sensor device 30A described above is that the image sensor device 30B does not use a re-crystallized silicon layer approach to bias the isolation wells. Instead, when the interconnect structure 240 is formed, one or more contacts/vias are formed on the doped trench liners, for example contacts/vias 320 and 321 formed on the trench liner 110. These contacts/vias 320-321 are electrically coupled to the trench liner 110 and may also be electrically coupled to external devices through the interconnect structure 240. Thus, the contacts/vias allow electrical connections to be made between external devices and the isolation wells surrounding the radiation-detection devices 160-161. A single voltage (for example, ground) may then be applied to all the isolation wells, so that these isolation wells are no longer floating.

Figure 9:
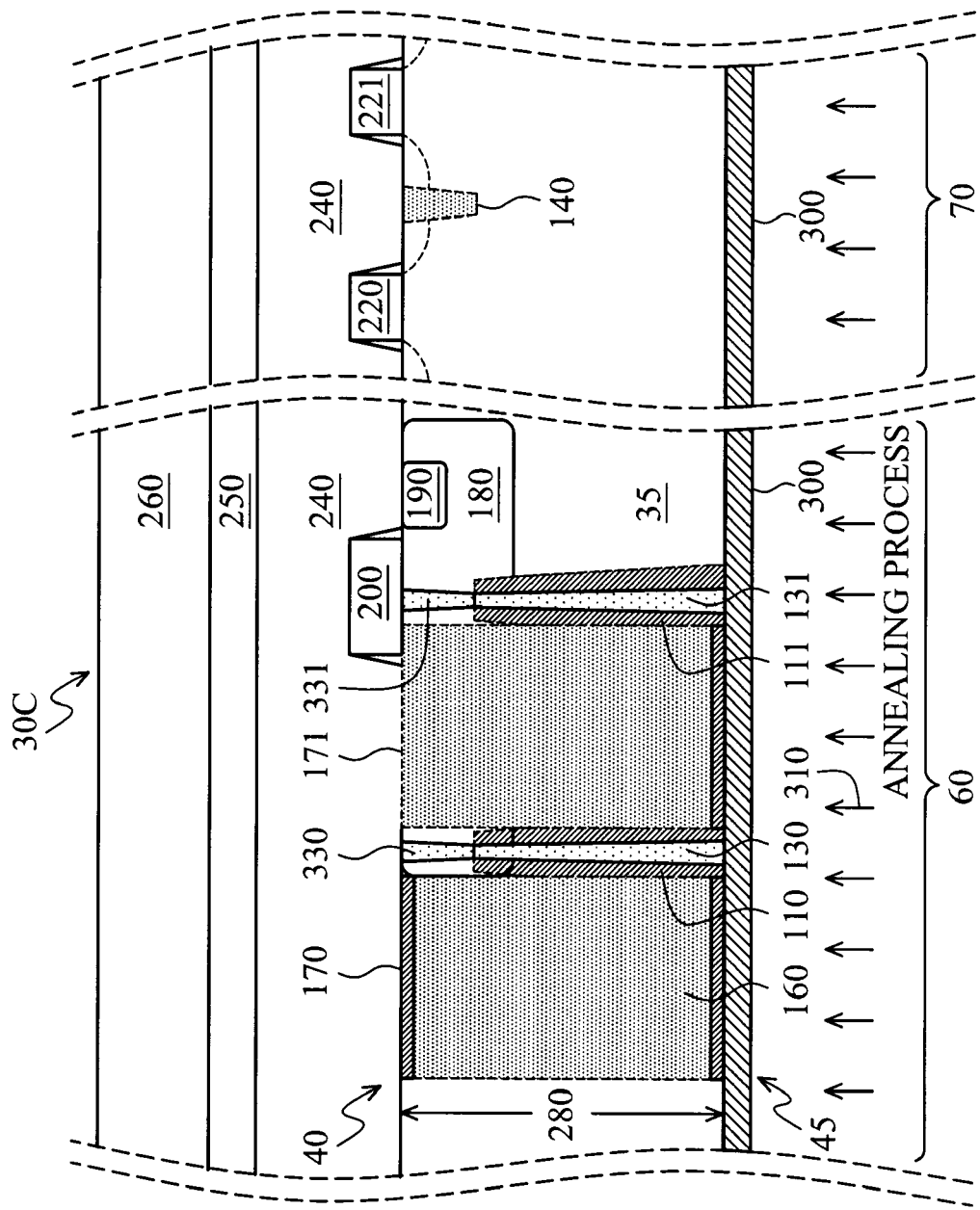

Referring to FIG. 9, an image sensor device 30C is illustrated. One difference between the image sensor device 30C and the image sensor device 30A described above is that the DTI features 130 and 131 of the image sensor device 30C are formed from the back side 45. In other words, the DTI features 130-131 extend from the back side 45 toward the front side 40. The DTI features 130-131 do not extend all the way to the front surface of the substrate 35, however. Shallow trench isolation features 330 and 331 are formed from the front side 40 of the substrate and are approximately aligned with the DTI features 130 and 131, respectively. In the embodiment illustrated in FIG. 9, the STI features 330-331 come into contact with (or abut) the DTI features 130-131, respectively. Further, the doped well 180 extend to the left side so that the STI features 330-331 and portions of the DTI features 130-131 are also disposed within the doped well 180. Hence, the doped well 180 here can also be considered a part of the isolation well surrounding the radiation-detection devices 160-161.

In this embodiment, the DTI features 130-131 and the STI features 330-331 (and the isolation wells surrounding them) in conjunction serve as isolation structures to prevent electrical and optical cross-talk between the radiation-detection devices 160-161. Meanwhile, the re-crystallized silicon approach is used to bias the isolation wells.

Figure 10:
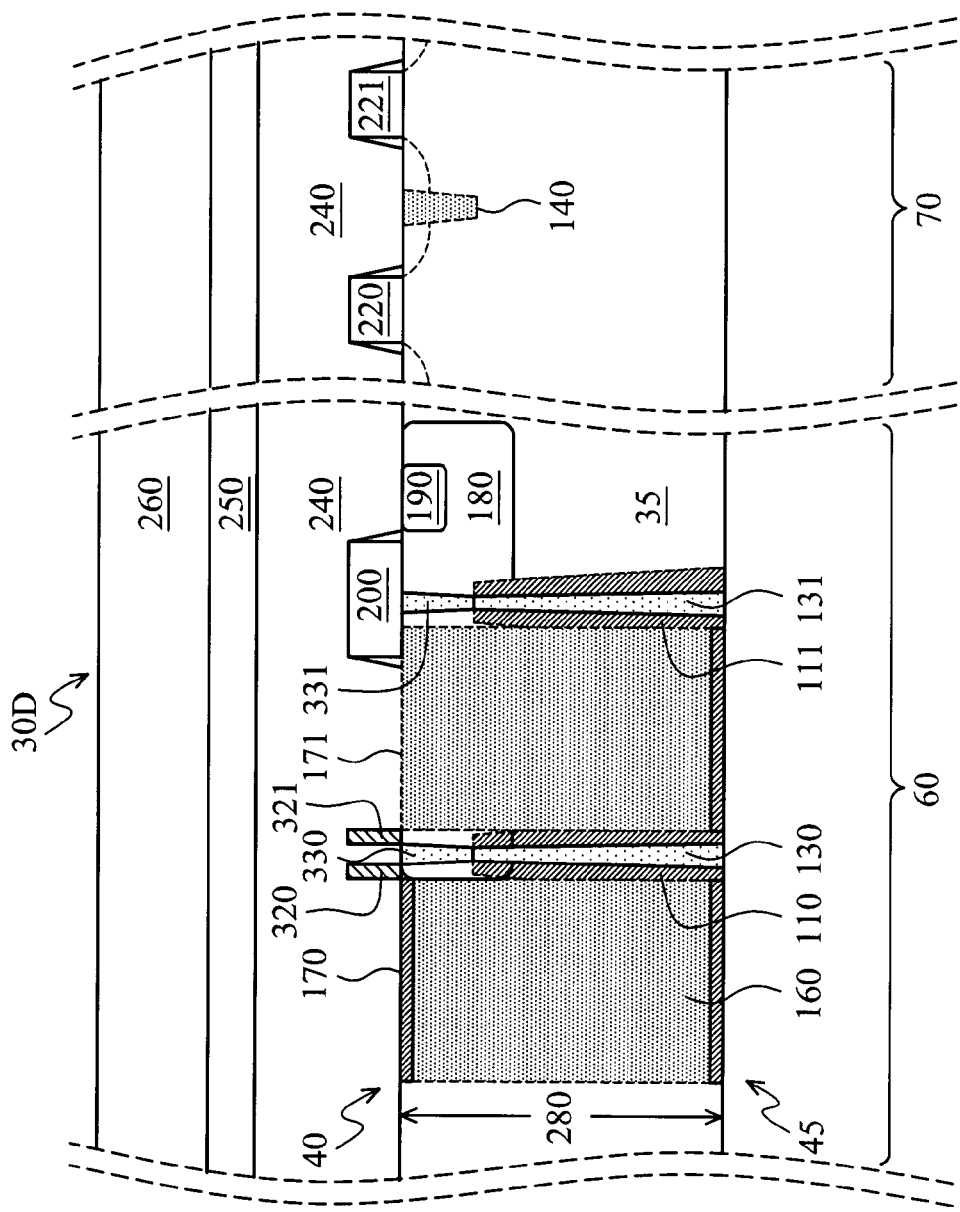

Referring to FIG. 10, an image sensor device 30D is illustrated. The image sensor device 30D incorporates aspects of both the image sensor devices 30B and 30C. In particular, the image sensor 30D employs the STI/DTI combination approach of the image sensor 30C, and also uses the vias/contacts 320-321 to bias the isolation wells instead of using a re-crystallized silicon layer to do so. The vias/contacts 320-321 are formed on portions of the doped well 180 surrounding the STI feature 330.

Figure 11:
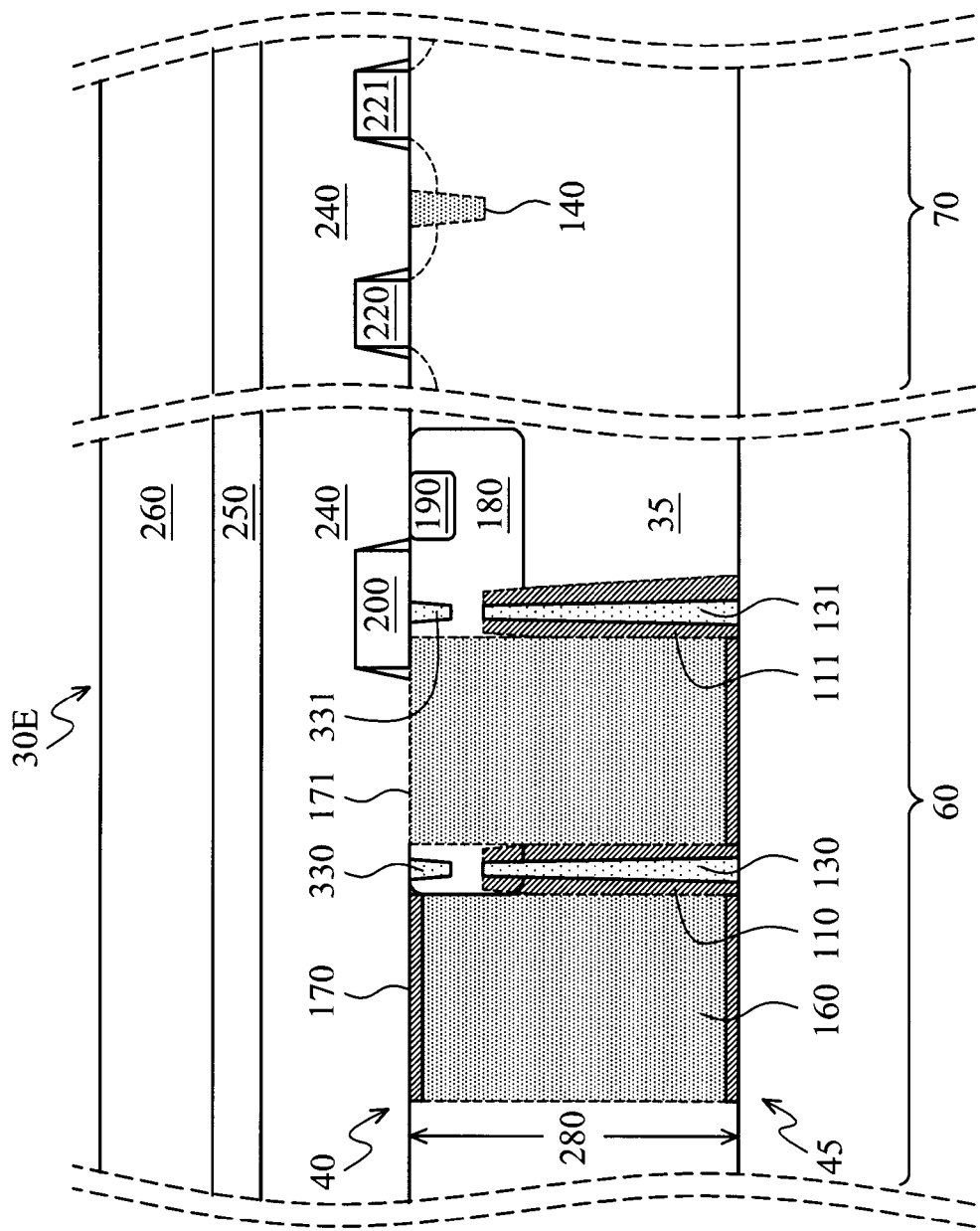

Referring to FIG. 11, an image sensor device 30E is illustrated. The image sensor device 30E is similar to the image sensor devices 30D, except that the STI features 330-331 and the DTI features 130-131 are not abutting each other. Instead, a gap (or portions of the doped well 180) separates the STI features 330-331 and the DTI features 130-131, respectively. As such, the isolation wells here are both coupled to the doped well 180, and the isolation wells can be biased by biasing the doped well 180. Consequently, neither the contacts/vias coupling the isolation wells nor the re-crystallized silicon layer is used in this embodiment.

Figure 12:
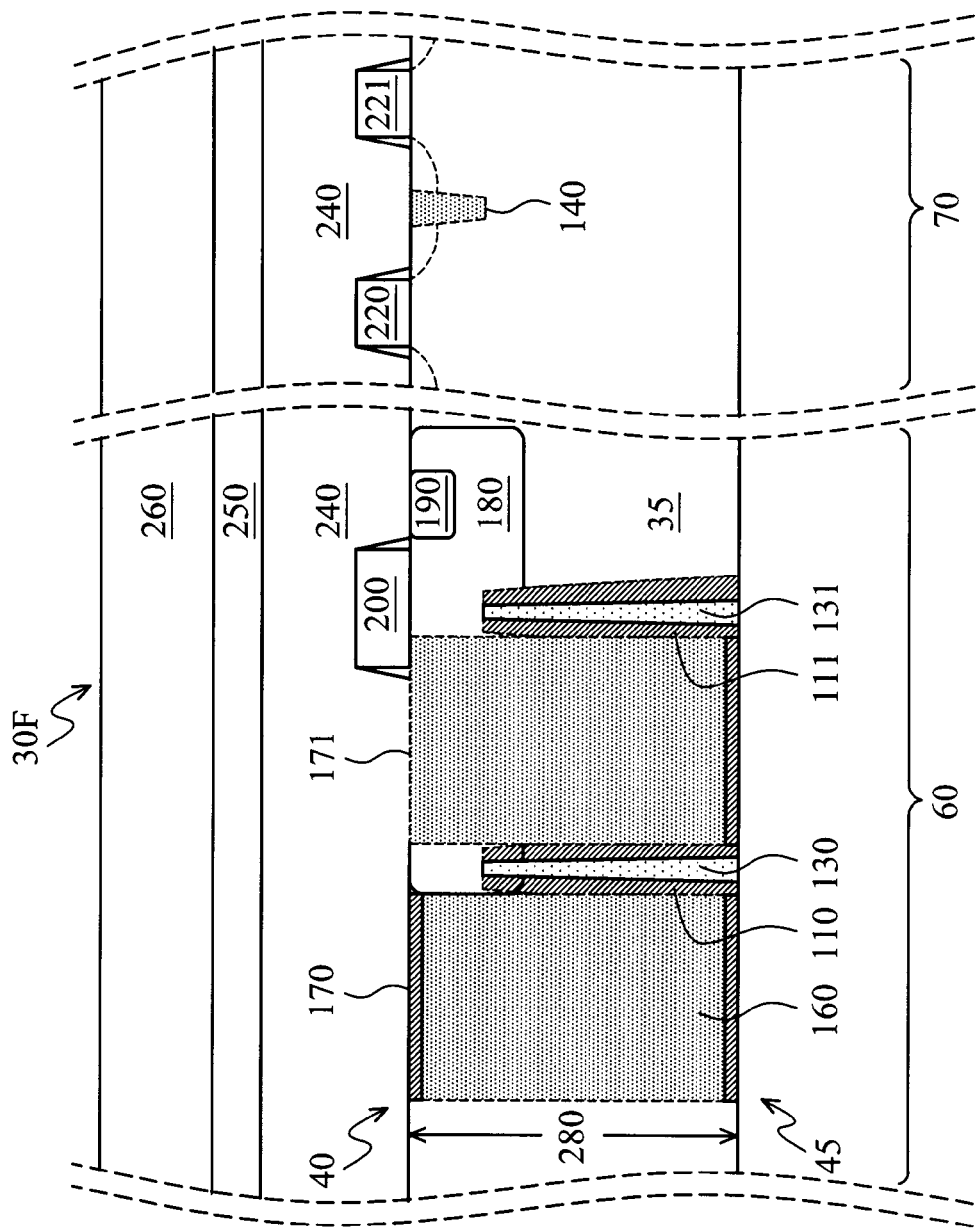

Referring to FIG. 12, an image sensor device 30F is illustrated. The image sensor device 30F is similar to the image sensor devices 30E, except that the STI features 330-331 are not formed. Once again, the image sensor device 30F uses the doped well 180 to bias the isolation wells surrounding the radiation-detection devices 160-161, instead of using the vias/contacts or the re-crystallized silicon layer to bias the isolation wells.

Compared to traditional BSI image sensor devices, several advantages are offered by the various embodiments described above and illustrated in FIGS. 2-12. It is understood, however, that different embodiments may offer different advantages, and that no particular advantage is required by all embodiments. One of the advantages is reduced cross-talk in the image sensor device. Traditionally, shallow trench isolation devices are used to isolated adjacent pixels. The relatively short depth of STI devices may hinder the STI devices' ability to sufficiently isolate the adjacent pixels, since leakage charge carriers may go "under" or around the STI devices to reach adjacent pixels. In comparison, the embodiments of the present disclosure use a deep trench isolation feature to isolate adjacent pixels. The relatively long depth of the DTI devices can adequately block cross-talk between adjacent pixels, as it is much harder for leakage charge carriers to go around the DTI devices.

Another advantage is that the doped trench liners are formed to have a relatively uniform doping profile. Traditional image sensor devices may not have doped trench liners at all, or if anything, a doped region below the trench isolation features but no doped regions behind the side walls of the trench isolations. Thus, the traditional trench isolation features may not adequately capture the defects along the side walls of the trenches. Here, the uniform doping profile of the trench liners allows the doped trench liners to adequately trap the defects along the surfaces of the deep trenches, which again reduces cross-talk.

One more advantage is that the isolation wells discussed herein are biased to the same potential (for example electrical ground) through various approaches such as using re-crystallized silicon layer, forming vias/contacts coupling the isolation wells, or using a doped well. Thus, the isolation wells are no longer electrically floating, which improves the performance of the image sensor device.

It is understood that additional processes may be performed to complete the fabrication of the image sensor devices 30A-30F. For example, an anti-reflective coating (ARC) layer may be formed over the back side 45. The ARC layer serves to reduce reflection of radiation waves projected toward the back side 45. Thereafter, a color filter layer may be formed over the ARC layer. The color filter layer can support the filtering of radiation waves having a particular range of wavelengths, which may correspond to a particular light color, for example red, green, or blue. Thus, the color filter layer may be used to only allow light having a predetermined color to reach the radiation-detection devices 160-161. Afterwards, a micro lens layer may be formed over the color filter layer for directing projected radiation toward the radiation-detection devices 160-161 thereon and therethrough. The micro lens layer may be positioned in various arrangements and have various shapes depending on a refractive index of material used for the micro-lens layer and distance from the surface of the image sensor devices 30A-30F. The ARC layer, the color filter layer, and the micro lens layer are not illustrated for the sake of simplicity.

The image sensor devices 30A-30F may include additional components such as charge-coupled devices (CCD) and input/output circuitry that provide an operational environment for the pixels and for supporting external communication with the pixels. These components are also not illustrated herein for the sake of simplicity.

One of the broader forms of the present disclosure involves an apparatus that includes a back side illuminated image sensor device. The image sensor device includes a substrate having a front side and a back side. The image sensor device includes a radiation-detection device formed in the substrate. The radiation-detection device is operable to detect a radiation wave that enters the substrate through the back side. The image sensor device also includes an isolation structure formed in the substrate and adjacent to the radiation-detection device. The isolation structure includes a deep trench isolation device and a doped trench liner that at least partially surrounds the deep trench isolation device.

Another of the broader forms of the present disclosure involves a back side illuminated image sensor device that includes a substrate having a front surface and a back surface opposite the front surface. The image sensor device also includes a radiation-sensing region that is disposed in the substrate. The radiation-sensing region is operable to sense radiation projected toward the radiation-sensing region through the back surface. The image sensor device further includes a deep trench isolation feature disposed adjacent to the radiation-sensing region. The image sensor device also includes a doped layer that at least partially surrounds the deep trench isolation feature in a conformal manner.

Still another of the broader forms of the present disclosure involves a method of fabricating an image sensor device. The method includes forming an isolation structure in the substrate. The isolation structure has a deep trench isolation device and a doped trench liner that at least partially surrounds the deep trench isolation device. The method also includes forming a radiation-detection device in the substrate. The radiation-detection device is formed adjacent to the isolation structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus comprising a back side illuminated (BSI) image sensor device that includes:
   a substrate having a front side and a back side;
   a radiation-detection device formed in the substrate, the radiation-detection device being operable to detect a radiation wave that enters the substrate through the back side;
   an isolation structure formed in the substrate and adjacent to the radiation-detection device, the isolation structure including a deep trench isolation device and a doped trench liner that at least partially surrounds the deep trench isolation device
   a first pinned implant layer formed over a front side of the radiation-detection device; and
   a second pinned implant layer formed over a back side of the radiation-detection device;
   wherein the first and second pinned implant layers are each electrically coupled to the doped trench liner and have the same doping polarity as the doped trench liner.

2. The apparatus of claim 1, wherein the doped trench liner is formed conformal to the deep trench isolation and has a substantially uniform doping profile.

3. The apparatus of claim 1, wherein the BSI image sensor device further includes an interconnect structure formed over the front side of the substrate, the interconnect structure having a contact formed on the doped trench liner.

4. The apparatus of claim 1, wherein the BSI image sensor device further includes a re-crystallized silicon layer formed over the back side of the substrate.

5. The apparatus of claim 4, wherein the BSI image sensor device has a pixel region and a periphery region, the radiation-detection device and the isolation structure being formed in the pixel region; and wherein the re-crystallized silicon layer is formed over both the pixel region and the periphery region and is electrically coupled to the doped trench liner.

6. The apparatus of claim 1, wherein:
   the radiation-detection device includes a photodiode doped with a first type dopant;

the deep trench isolation device includes an oxide material and has a depth in a range from approximately 1 micron to about 3 microns; and the doped trench liner includes a second type dopant opposite the first type.

7. The apparatus of claim 1, wherein the deep trench isolation device extends from the back side, wherein the isolation structure further includes a shallow trench isolation device that extends from the front side and is approximately aligned with the deep trench isolation device.

8. An image sensor device, comprising:
a substrate having a front surface and a back surface opposite the front surface;
a radiation-sensing region disposed in the substrate, the radiation-sensing region being operable to sense radiation projected toward the radiation-sensing region through the back surface;
a deep trench isolation feature disposed adjacent to the radiation-sensing region;
a shallow trench isolation feature disposed adjacent to the radiation-sensing region and being substantially aligned with the deep trench isolation feature; and
a doped layer that at least partially surrounds the deep trench isolation feature in a conformal manner.

9. The image sensor device of claim 8, wherein:
a first portion of the doped layer disposed near the front surface has a first doping concentration level;
a second portion of the doped layer disposed near the back surface has a second doping concentration level; and
the first and second doping concentration levels are not substantially different from each another.

10. The image sensor device of claim 8, further including a conductive via disposed on the doped layer, the via being electrically coupled to the doped layer.

11. The image sensor device of claim 8, further including a re-crystallized silicon layer disposed over the back surface of the substrate.

12. The image sensor device of claim 8, wherein the deep trench isolation feature extends from the back surface, and wherein the shallow trench isolation feature extends from the front surface and abuts the deep trench isolation feature.

13. The image sensor device of claim 8, wherein the doped layer is a first doped layer, and further comprising:
a second doped layer formed over a front side of the radiation-sensing region; and
a third doped layer formed over a back side of the radiation-sensing region;
wherein the second and third doped layers are each electrically coupled to the first doped layer and have the same doping polarity as the first doped layer.

14. The image sensor device of claim 13, wherein the radiation-sensing region is oppositely-doped from the first, second, and third doped layers.

15. A method of fabricating an image sensor device, comprising:
providing a substrate having a front side and a back side;
forming an isolation structure in the substrate, the isolation structure including a deep trench isolation device and a doped trench liner that at least partially surrounds the deep trench isolation device;
forming a radiation-detection device in the substrate, the radiation-detection device being adjacent to the isolation structure and being operable to detect a radiation wave that enters the substrate through the back side;
forming a first pinned implant layer over a front side of the radiation-detection device, the first pinned implant layer having the same doping polarity as the doped trench liner;
thereafter thinning the substrate from the back side; and
forming a second pinned implant layer over a back side of the radiation-detection device, the second pinned implant layer having the same doping polarity as the doped trench liner;
wherein the forming the first and second pinned implant layers are carried out in a manner so that the first and second pinned implant layers are each electrically coupled to the doped trench liner.

16. The method of claim 15, wherein the forming the isolation structure includes:
etching the substrate to form an opening in the substrate, the opening having a depth that is greater than about 1 micron;
performing a plasma diffusion process to exposed surfaces of the opening to form the doped trench liner; and
thereafter filling the opening with a dielectric material to form the deep trench isolation device.

17. The method of claim 16, wherein the performing the plasma diffusion process is carried out so that the doped trench liner has a substantially uniform doping profile.

18. The method of claim 16, wherein the etching the substrate is carried out in a manner so that the opening is etched from the back side; and further including:
etching a shallow opening from the front side, the shallow opening being approximately aligned with the deep trench isolation device; and
thereafter filling the shallow opening with a dielectric material to form a shallow trench isolation device.

19. The method of claim 15, further including forming an interconnect structure over the front side of the substrate, the forming the interconnect structure including forming a contact on the doped trench liner.

20. The method of claim 15, further including:
forming an amorphous silicon layer over the back side of the substrate; and
forming a laser annealing process on the amorphous silicon layer to melt and re-crystallize the amorphous silicon layer.

* * * * *